(12) United States Patent
Ishikawa et al.

(10) Patent No.: US 6,319,371 B2
(45) Date of Patent: *Nov. 20, 2001

(54) FILM FORMING APPARATUS

(75) Inventors: Hiroichi Ishikawa; Masayasu Kakinuma, both of Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/339,849

(22) Filed: Jun. 25, 1999

(30) Foreign Application Priority Data

Jul. 1, 1998 (JP) .................................. P10-186372

(51) Int. Cl.[7] .................................................. C23C 14/34
(52) U.S. Cl. ........................... 204/298.03; 204/298.07; 204/298.09; 204/298.24; 204/298.25
(58) Field of Search ..................... 204/298.03, 298.07, 204/298.09, 298.24, 298.25; 118/712, 718, 719, 665

(56) References Cited

U.S. PATENT DOCUMENTS

| | | | |
|---|---|---|---|
| 4,693,803 | * 9/1987 | Casey et al. | 204/298 |
| 4,936,964 | * 6/1990 | Nakamura | 204/192.13 |
| 5,135,581 | * 8/1992 | Tran et al. | 136/256 |
| 5,911,856 | * 6/1999 | Suzuki et al. | 204/192.13 |

* cited by examiner

Primary Examiner—Nam Nguyen
Assistant Examiner—Steven H. VerSteeg
(74) Attorney, Agent, or Firm—Sonnenschein, Nath & Rosenthal

(57) ABSTRACT

A film forming apparatus comprises a sputtering chamber, a cooling drum disposed at an central portion thereof for cooling a roll film in contact with the surface thereof, a roll chamber, an $SiO_x$ film forming chamber and a monitor room disposed to the periphery of the drum, a sputter cathode disposed to the $SiO_x$ film forming chamber, and a moisture pump such as a cryogenic panel disposed in the film forming chamber for effectively discharging the moisture by which the partial pressure of the moisture in the film forming chamber is kept roll, in which the light absorption of the $SiO_x$ film after formation is monitored by an InSitu transmission light monitor, the value x for the $SiO_x$ is judged by the transmittance of light of the $SiO_x$ film to control the oxygen flow rate by an MFC such that the value x reaches an aimed value, thereby enabling to form an adhesion layer having sufficient adhesion and good permeability on the substrate.

12 Claims, 1 Drawing Sheet

FIG.1A
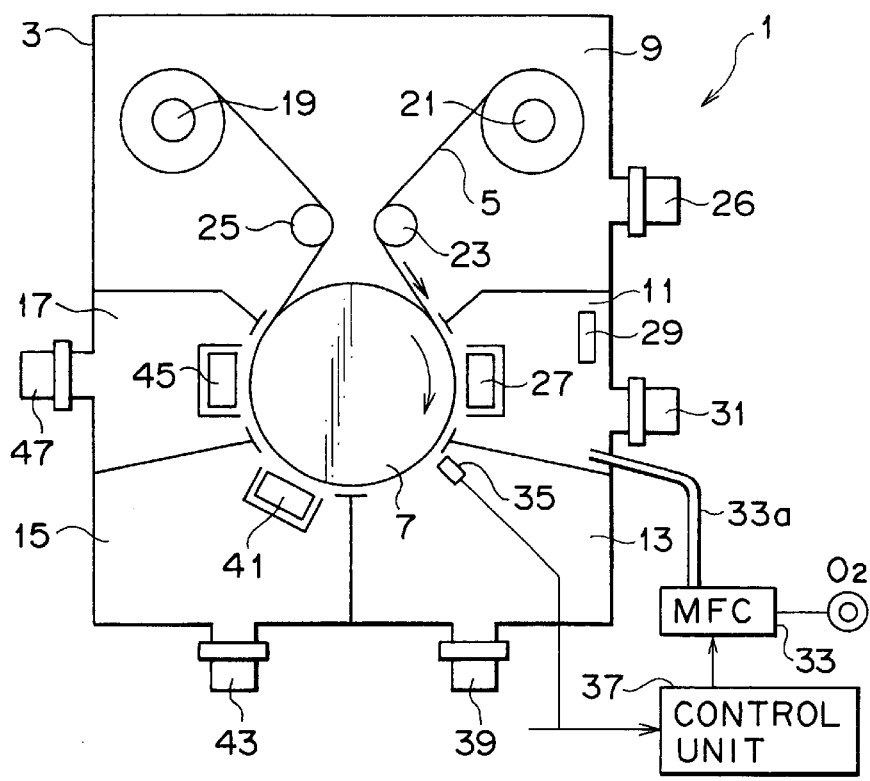
FIG.1B
FIG.2
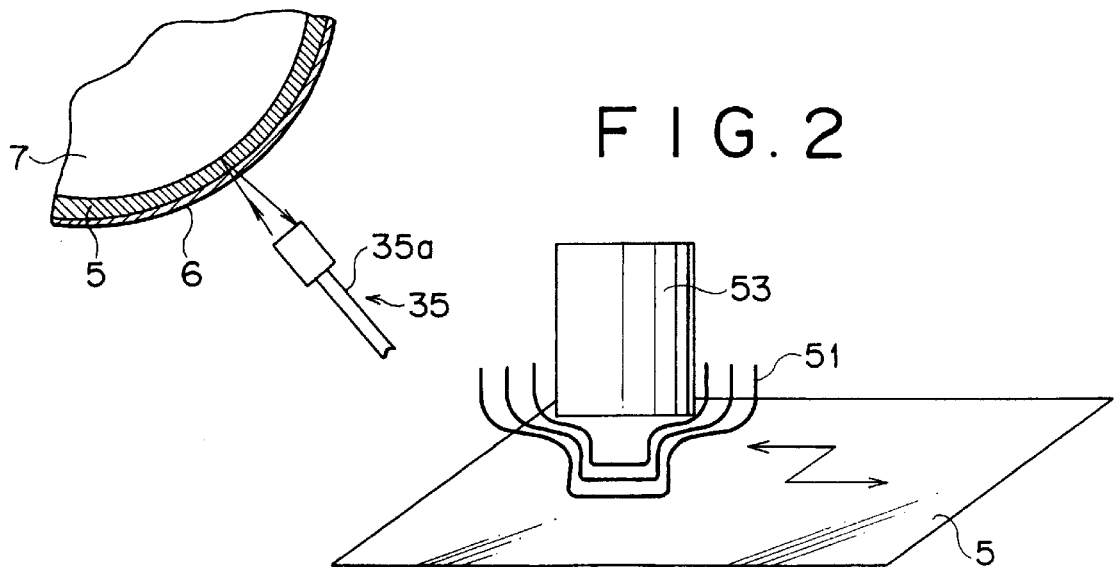

FILM FORMING APPARATUS

RELATED APPLICATION DATA

The present application claims priority to Japanese Application No. P10 186372 filed Jul. 01, 1998, which application is incorporated herein by reference to the extent permitted by law.

BACKGROUND OF THE INVENTION

1. Field of the Invention

The present invention relates to a film forming apparatus for forming a film of an adhesion layer on a substrate and more particularly to a film forming apparatus capable of forming a film of an adhesion layer having a sufficient adhesion and good permeability to a substrate by keeping the partial pressure of moisture low in the film forming apparatus.

2. Description of the Related Art

In existent film forming apparatus, when a thin film (for example, an optical thin film or an anti-reflection film) is formed on a plastic substrate, poor adhesion between the thin film and the plastic substrate often gives rise to a problem. As a method of solving the problem, it may be considered a method of increasing the adhesion strength by forming an adhesion layer for adhering a thin film to a plastic substrate, in which an $SiO_x$ film (x<2) or the like is used as the adhesion layer.

However, in the existent film forming apparatus, it is difficult to stably form on $SiO_x$ film on the plastic substrate in the existent film forming apparatus. This is because $SiO_x$ has no stoichiometrically stable composition as in $SiO_2$, so that x can not be defined constant easily and it is difficult to property control the amount of oxygen supplied to the plastic substrate upon film formation in order to make x constant. Further, the effect of the adhesion layer (adhesion strength) varies depending on the value for x, in which the adhesion is reduced as x approaches 2, whereas the adhesion is improved as x decreases. However, as x decreases, the transmittance of light of the $SiO_x$ film is lowered and the film is not suitable to the application use for the optical film.

In view of the foregoing situations, it may be considered the following method of stably forming an $SiO_x$ film with good transmission of light and adhesion. This is a method of observing the transmittance of light of a formed $SiO_x$ film upon forming the $SiO_x$ film on the plastic substrate in the film forming apparatus, judging based on the value whether the current flow rate of oxygen supplied by an MFC or the like to a plastic substrate is excessive or insufficient and controlling the flow rate of oxygen to be supplied depending on the result of the judgement.

Then, in order to control x for the $SiO_x$ film to an appropriate value, another factor should be taken into consideration. This is a requirement that the partial pressure of the moisture in a film-forming chamber be kept low upon formation of the $SiO_x$ film in the film forming apparatus. For example, when an $SiO_x$ film is formed by a sputter device having an Si target, if the partial pressure of moisture in the $SiO_x$ film forming chamber is high, oxygen contained in the moisture reacts with Si tending to increase the value x for the $SiO_x$ film exceeding an aimed value. This makes it difficult to control the transmittance of the $SiO_x$ film to an aimed value.

Namely, as described above, the transmittance of a light of the formed $SiO_x$ film is monitored, and the flow rate of oxygen supplied by an MFC or the like is properly controlled based on the value to form an $SiO_x$ film having a desired value for x, in which oxygen other than oxygen supplied is already present if the partial pressure of the moisture in the $SiO_x$ film forming chamber is high. Then, a margin upon controlling the amount of oxygen supplied by the MFC is extremely narrowed and, as a result, the amount of oxygen to be supplied can no more be controlled appropriately and the value x for the formed $SiO_x$ film can not be controlled stably. If the partial pressure of the moisture in the $SiO_x$ film forming chamber is excessively high, the value x is increased more than the aimed value even with no supply of oxygen at all from the MFC to the film forming chamber, thereby making it impossible to control the transmittance of the $SiO_x$ film to an aimed value.

SUMMARY OF THE INVENTION

The present invention has been accomplished in view of the foregoing situations and an object thereof is to provide a film forming apparatus capable of forming an adhesion layer with good light transmittance of light onto a substrate by keeping a partial pressure of moisture low in a film forming chamber.

The foregoing subject can be attained in accordance with a film forming apparatus of the present invention in which a film-forming chamber is disposed for forming an adhesion film on a substrate, wherein a moisture discharging means is disposed in the film-forming chamber for discharging the moisture.

The film forming apparatus preferably comprises an $O_2$ supply means for supplying $O_2$ under flow rate control to the film forming chamber.

The substrate preferably comprises a rolled film and, further, a roll for winding the film is disposed preferably.

The substrate preferably comprises a rolled PET (polyethyleneterephthalate) or PEN (polyethylenenaphthalate) film.

The substrate is preferably a rolled film and the film forming apparatus further comprises preferably a roll for winding the film and a cooling drum for cooling the film upon formation of the adhesion film on the film.

The film forming apparatus preferably comprises a film forming chamber for forming a thin film on the adhesion film, and the thin film preferably comprises one or plurality of layers of optical thin films.

The film forming apparatus further comprises a film forming chamber for formation of a thin film on the adhesive layer, and the thin film preferably comprises one or plurality of layers of anti-reflection films.

The adhesion film is preferably a $SiO_x$ film.

The adhesion film preferably comprises a $TiO_x$ film.

The film forming apparatus further preferably comprises a film forming chamber for continuously forming a thin film on an adhesive film.

Formation of the adhesion film is preferably conducted by sputtering.

The moisture discharging means preferably comprises a pump of high moisture discharging performance, which is a POLYCOLD for adsorbing the moisture in a cooling unit.

The film forming apparatus further comprises vacuum pump for evacuating the inside of the film forming chamber.

The film forming apparatus further comprises preferably a transmittance observing means for observing the transmittance of light of the adhesion layer formed in the film forming chamber.

The film forming apparatus further comprises preferably an InSitu transmission light monitor for observing the transmittance of light of the adhesion layer to be formed in the film forming chamber.

The film forming apparatus further comprises preferably a transmittance observing means for observing the light transmittance of the adhesion layer formed in the film forming chamber, the wavelength of light observed by the means being 450 nm or less. The film forming apparatus preferably comprises a transmittance measuring means for measuring the transmittance of light of the adhesion layer formed in the film forming chamber, the wavelength of light observed by the means being 400 nm.

The substrate preferably comprises a plastic substrate having, on the surface, a layer formed in a coating process of a hard coating.

DESCRIPTION OF THE ACCOMPANYING DRAWINGS

FIG. 1A is a plan view schematically showing a film forming apparatus as a preferred embodiment of the present invention;

FIG. 1B is an enlarged schematic view showing a transmission light monitor 35 and the vicinity thereof shown in FIG. 1A; and FIG. 2 is a view explaining a method of evaluating adhesion between a film strip and a thin film.

DETAILED DESCRIPTION OF THE PREFERRED EMBODIMENT

A preferred embodiment of the present invention is to be explained with reference to the drawings.

FIG. 1A is a plan view schematically showing a film forming apparatus as a preferred embodiment of the present invention; and FIG. 1B is an enlarged schematic view showing a transmission light monitor 35 and the vicinity thereof shown in FIG. 1A, for explaining a method of monitoring the transmittance of light of a $SiO_x$ film (x<2). The film-forming apparatus is a sputtering device for forming a film by sputtering on a roll film (for example, plastic roll film).

As shown in FIG. 1A, a sputtering apparatus 1 has a sputtering chamber 3, and a cooling drum 7 is disposed to a central portion of the sputtering chamber 3 for cooling a roll film (plastic substrate) 5 in contact with the surface thereof. In the sputtering chamber 3 and at the periphery of the cooling drum 7, are disposed an $SiO_x$ film forming chamber 11, a monitor chamber 13, a first film forming chamber 15 and a second forming film chamber 17. The plastic substrate 5 may be a rolled PET or PEN film.

A roll 19 and a roll 21 each having a film 5 wound therearound are disposed in the roll chamber 9. The film 5 wound around the roll 21 is wound by way of a guide 23 around the periphery of the roll 19. The film 5 is further wound around the roll 19 by way of a guide 25. The film 5 is constituted to be transported as shown by an arrow. Further, a turbo pump (vacuum pump) 26 for evacuating the inside of the roll chamber 9 is connected with the chamber 9.

In the $SiO_x$ film forming chamber 11, an $SiO_x$ sputtering cathode (for example, a dual magnetron cathode) 27 is disposed at a position opposing the film 5 wound around the cooling drum 7. The film 5 is sputtered on the cooling drum 7 by the sputter cathode 27. Two Si targets (not illustrated) are disposed side by side in the vicinity of the surface of the cooling drum 7. Further, an MFC 33 is connected for supplying oxygen while controlling the flow rate by way of a pipeline 33a into the chamber 11. Further, the $SiO_x$ film forming chamber 11 is constituted such that Ar is supplied at a predetermined flow rate (not illustrated). Further, a moisture pump 29 such as a cryogenic panel is disposed in the chamber 11 for effectively discharging the moisture. A pump having a high moisture discharging performance is used for the moisture pump 29, for example, POLYCOLD (registered trade mark), a pump for adsorbing moisture to a cooling portion. Further, a vacuum pump 31 for evacuating the $SiO_x$ film forming chamber 11 is connected for evacuating the inside of the chamber 11.

The monitor chamber 13 is a chamber for monitoring the transmittance of light (or absorption of light) of the $SiO_x$ film formed on the film 5 in the $SiO_x$ film forming chamber 11. Accordingly, an InSitu 35 as a transmission light monitor is disposed in the monitor chamber 13 and the InSitu 35 monitors the absorption of light in the $SiO_x$ film after film formation. Further, the transmission light monitor 35 is connected with a control unit 37, which is then connected with the MFC 33, and is so constituted to monitor the state of light absorption of the $SiO_x$ film after film formation, send the thus obtained transmittance of light to the control section 37, judge the value x for the $SiO_x$ film by the control unit 37, deliver an instruction to increase the oxygen flow rate from the control unit 37 to the MFC 33 if the value x is smaller than a desired value, while deliver an instruction to decrease the oxygen flow rate from the control unit 37 to the MFC 33 if the value x is larger than the desired value. In this way, the flow rate of oxygen supplied to the film 5 upon formation of the $SiO_x$ film on the film 5 is controlled to an appropriate amount. If x is small, the transmittance of light of the $SiO_x$ film tends to be lowered. Further, a vacuum pump 39 for evacuating the inside of the monitor chamber 13 is connected to the chamber 13.

The transmission monitor 35 is to be explained more specifically.

As shown in FIG. 1B, the transmission light monitor 35 has an optical fiber 35a. A light at a wavelength of about 400 nm is irradiated by way of the optical fiber 35a as shown by an arrow in the monitor chamber 13 to an $SiO_x$ film 6 formed on a plastic roll film 5. The light transmits the $SiO_x$ film 6 and the film 5 and, reaches the cooling drum 7, and a light reflected on the surface of the cooling drum 7 transmits again the film 5 and the $SiO_x$ film 6 and returns to the InSitu transmission light monitor 35. The intensity of the returned light is detected by the monitor 35, and the intensity of the reflected light and the intensity of the irradiated light are compared to measure the transmittance of light of the $SiO_x$ film 6. The wavelength of the irradiated light is set to 400 nm, because $SiO_x$ has a stronger absorption for a light in a shorter wavelength area, so that the sensitivity to the light transmission relative to the amount of $O_2$ is increased when measuring or observing the transmission of light at 400 nm and, as a result, the controllability for the oxygen flow rate by the transmission light monitor is improved.

Further, when the transmittance of the light (wavelength: 400 nm) of the $SiO_x$ film 6 is measured by the method described above, and the transmittance is about 95%, then the $SiO_x$ film 6 has a satisfactory adhesion.

In the first film forming chamber 15, a first sputter cathode 41 is disposed at a position opposing to the film 5 wound around the cooling drum 7. The film 5 is sputtered by the sputter cathode 41 on the cooling drum 7. Thus, a thin film (for example, optical thin film or anti-reflection thin film)

can be formed on the $SiO_x$ film 6 formed on the film 5. In this case, since the $SiO_x$ film 6 between the plastic roll film 5 and the optical thin film acts as an adhesion layer, close adhesion between the film 5 and the optical thin film is made firm. Further, a vacuum pump 43 for evacuating the inside of the first film forming chamber 15 is connected for evacuating the inside of the chamber 15.

In the second film forming chamber 17, a second sputter cathode 45 is disposed at a position opposing to the film 5 wound around the cooling drum 7. The film 5 is sputtered by the sputter cathode 45 on the cooling drum 7. Thus, a thin film can be formed further on the optical thin film. Further, a vacuum pump 47 for evacuating the inside of the second film forming chamber 17 is connected for evacuating the inside of the chamber 17.

Concrete conditions when the $SiO_x$ film 6 was formed on the plastic film roll 5 by the sputtering device 1 shown in FIG; 1A, are as described below. The following conditions are shown as a mere example, and can be changed optionally. The $SiO_x$ film 6 formed under the conditions has a sufficient adhesion and good transmittance.

| | |
|---|---|
| Substrate (film) | PET (with hard coating) 188 μm thickness, 1.2 m width |
| Cathode | Dual magnetron |
| Power | 1.5 kW (AC power source) |
| Ar flow rate | 100 sccm |
| $O_2$ flow rate | −15 sccm (controlled by MFC) |
| Target | Si; 100 mm width, 1500 mm length, 12 mm × 2 height (dual) |

In the embodiment described above, the partial pressure of the moisture in the $SiO_x$ film forming chamber 11 can be kept low by disposing the moisture pump 29 such as a cryogenic panel in the film forming chamber 11. Therefore, the flow rate of oxygen supplied to the film forming chamber 11 can be controlled by the MFC 33 with a large margin. This can facilitate the control for the oxygen flow rate by the MFC 33 in accordance with the instruction from the control section 37. Accordingly, the value x for the $SiO_x$ film 6 can be controlled to a desired value and the $SiO_x$ film 6 having a sufficient adhesion and good transmittance can be formed to the film 5.

In the embodiment described above, the first and the second film forming chambers 15 and 17 are disposed in the sputter chamber 3, but only the first film forming chamber 15 may be disposed in the sputter chamber 3 or three or more film forming chambers may also be disposed in the sputter chamber 3. Thus, a single or plurality of thin films can be formed on the film 5 by the film forming apparatus.

In the embodiment described above, the $SiO_x$ film 6 is used as the adhesion layer but other oxygen-containing adhesion layer may also be used and, for example, a $TiO_x$ film may also be used.

In other words, if the cryogenic panel 29 is not disposed in the $SiO_x$ film forming chamber 11, the transmittance of light (wavelength: 400 nm) of the $SiO_x$ film 6 is increased to 95% or higher even if oxygen is not introduced by the MFC 33 into the film forming chamber 11, so that an $SiO_x$ film having sufficient adhesion can no more be formed on the film 5.

Then, a method of evaluating close adhesion between the thin film (anti-reflection film or the like) formed by way of the $SiO_x$ film as the adhesion film on the film 5 by the sputtering device 1, and the film 5 will be explained with reference to FIG. 2. FIG. 2 is a view for explaining the method of evaluating the close adhesion between the film and the thin film.

At first, a thin film (anti-reflection film or the like) is formed by way of an $SiO_x$ film on the film 5 by the film forming apparatus shown in FIG. 1A and then the film 5 is left in an atmosphere at a temperature of 50° C. and a humidity of 90% for 48 hours. Then, as shown in FIG. 2, the film was placed on a bed not illustrated. Four sheets of bleached cotton fabric 51 wound around a 2 kg weight 53 and impregnated with an alcohol are brought into contact with the thin film on the film 5 and they are rubbed by reciprocating for 20 times forwardly and backwardly as shown by arrows.

After giving a damage by the method described above to the anti-reflection film formed on the film 5, peeling of the anti-reflection film is observed. As a result, peeling of the anti-reflection film was not observed for the anti-reflection film with the $SiO_x$ adhesion layer in which the $SiO_x$ film was formed between the film 5 and the anti-reflection film. On the contrary, peeling was observed for the anti-reflection film with no $SiO_x$ film in which the $SiO_x$ film was not formed between the film 5 and the anti-reflection film, and this did not pass the test described above.

As has been described above, the present invention can provide a film forming apparatus capable of forming an adhesion layer having sufficient adhesion and good transmittance on the substrate by keeping the partial pressure of moisture low in the film-forming chamber.

What is claimed is:

1. A film forming apparatus, comprising:
   (a) an oxygen supply,
   (b) a controller,
   (c) a first film forming chamber through which a substrate passes, the first film forming chamber housing a sputtering apparatus for sputtering a $SiO_x$ or a $TiO_x$ adhesion film on the substrate and a moisture discharging means, the first film forming chamber being connected to the oxygen supply, the oxygen supply being linked to the controller,
   (d) a monitor chamber adjacent to the first film forming chamber comprising a means for measuring a transmittance of light through the adhesion layer formed on the substrate in the first film forming chamber, the means for measuring being connected to the controller for sending a signal indicative of the measured transmittance of light to the controller, the controller converting the signal indicative of the measured light transmittance into a value for "x", wherein, when the value for "x" is below a predetermined acceptable lower limit, the controller increases the flow of oxygen by the oxygen supply to the first film forming chamber, and when the value for "x" is above a predetermined acceptable upper limit, the controller decreases the flow of oxygen by the oxygen supply to the first film forming chamber.

2. A film forming apparatus as defined in claim 1 further comprising a rolled film for supplying substrate to the first film forming chamber and a roll for winding the substrate and adhesion film.

3. A film forming apparatus as defined in claim 1, wherein the substrate comprises a rolled film selected from a group consisting of polyethylenenaphthalate (PEN) and polyethylene terephthalate (PET).

4. A film forming apparatus as defined in claim 1 further comprising a rolled film for supplying substrate to the first film forming chamber, a roll for winding the substrate and adhesion film, and a cooling drum for cooling the substrate and adhesion film upon formation of the adhesion film on the substrate.

5. A film forming apparatus as defined in claim 1 further comprising a second film forming chamber for forming a thin film on the adhesion film, and the thin film comprises one or a plurality layers of optical thin film.

6. A film forming apparatus as defined in claim 1 further comprising a second film forming chamber for forming a thin film on the adhesion film and the thin film comprises one or a plurality layers of anti-reflection film.

7. A film forming apparatus as defined in claim 1 further comprising a second film forming chamber for forming a thin film continuously on the adhesion film.

8. A film forming apparatus as defined in claim 1, wherein the moisture discharging means is a pump having a moisture adsorbing means and means for discharging the moisture to a cooling unit.

9. A film forming apparatus as defined in claim 1, wherein a vacuum pump is further disposed for evacuating the inside of the first film forming chamber.

10. A film forming apparatus as defined in claim 1, wherein the means for measuring comprises an InSitu transmission light monitor.

11. A film forming apparatus as defined in claim 1, wherein the wavelength of light measured by the means for measuring is 450 nm or less.

12. A film forming apparatus as defined in claim 1, wherein the wavelength of light measured by the means for measuring is 400 nm.

* * * * *